United States Patent [19]

Boos

[11] Patent Number: 5,430,383
[45] Date of Patent: Jul. 4, 1995

[54] METHOD FOR MEASURING CAPACITIVE LOADS

[75] Inventor: Robert E. Boos, Chandler, Ariz.

[73] Assignee: VLSI Technology, Inc., San Jose, Calif.

[21] Appl. No.: 205,972

[22] Filed: Mar. 3, 1994

[51] Int. Cl.6 ............................................. G01R 27/26
[52] U.S. Cl. .................................. 324/642; 324/519; 324/537; 324/679
[58] Field of Search ............... 324/642, 532, 533, 534, 324/679, 683, 677, 537, 519, 601, 658; 340/562

[56] References Cited

U.S. PATENT DOCUMENTS

| | | | |
|---|---|---|---|
| 3,248,646 | 4/1966 | Brazee | 324/519 |
| 4,500,834 | 2/1985 | Ko et al. | 324/534 |
| 4,791,351 | 12/1988 | La Traon et al. | 324/537 |
| 4,812,738 | 3/1989 | Itaya et al. | 324/601 |
| 5,006,794 | 4/1991 | Gal | 324/537 |
| 5,179,341 | 1/1993 | Whiteside | 324/534 |
| 5,187,430 | 2/1993 | Marek et al. | 324/537 |
| 5,202,639 | 4/1993 | McKeon et al. | 324/537 |
| 5,363,648 | 11/1994 | Modlin et al. | 324/537 |

*Primary Examiner*—Maura K. Regan
*Attorney, Agent, or Firm*—LaValle D. Ptak

[57] ABSTRACT

An automated method of verifying the capacitance loads on signal pins of an integrated circuit test load board employs a tester operating with transmission line techniques. The tester signal first is disconnected from the load board; and the rise time of the reflected waveform is measured between the ten percent and ninety percent values. The tester signal then is connected to the load board; and once again, the rise time of the reflected waveform is measured between the ten percent and ninety percent values. These two rise time values then are employed to calculate the total amount of edge loading capacitance on the path between the tester and the load board.

6 Claims, 1 Drawing Sheet

METHOD FOR MEASURING CAPACITIVE LOADS

BACKGROUND

Integrated circuit devices currently are being manufactured with a large number of pins, which include input/output pins, pins to be connected to one or more supply voltages (VDD), and pins which are to be connected to ground in the operation of the device. Sixty-four pin integrated circuit devices are common; and large scale integrated circuits, including up to five hundred-twelve pins, currently exist. In the manufacture of integrated circuit devices, and, in many cases, prior to the inclusion of such integrated circuit devices into equipment incorporating these devices, it is desirable to test the operating characteristics of devices. Typically, this is done by a multiple channel tester, which applies the required power supply and ground potentials to selected pins of the integrated circuit device under test (DUT), and also supplies signals to and receives signals from the input/output (I/O) pins of the device under test. The integrated circuit tester equipment typically is interconnected with an integrated circuit device under test (DUT) by means of a load board, which provides the desired interface between the tester and the device to be tested.

Load boards or performance boards for testing integrated circuit devices are relatively complex and expensive. Frequently, load boards are custom designed to provide a specific interface between a particular integrated circuit device which is to be tested and the tester, which is used to operate the device during its test mode of operation.

Typical load boards are printed wire boards, which have a variety of different value chip capacitors soldered to them, depending upon the AC loading specifications of the device to be tested with the particular load board. These chip capacitors are fragile and are unmarked. They can be unknowingly damaged, or the load board fabricator easily can solder an incorrect value capacitor on the load board. The capacitors often are tied to the DUT through relays. The relays may be defective, or they can be knocked off the load board through normal handling. Load board defects of these types easily can go unnoticed, which ultimately results in the shipping of products (DUT's) which have not been tested to the specified capacitive loads.

Typically, load boards are checked, either initially or periodically during their useful lifetime, by test engineers manually measuring the capacitance on a particular pin only if the AC timing measurement on that pin for a DUT is in question. Usually, this manual measurement is only done during the device characterization process, and is rarely re-checked once the board has been released to production. Consequently, if a defect in a capacitor is missed during this initial characterization process check, that defect very well may go unnoticed for the testing of large numbers of DUT's.

Two papers which describe the operation of modern high-speed automatic test equipment for the testing of advanced CMOS devices, dealing with the transmission line effects in testing such devices, are "*Transmission Line Testing of CMOS—A Full Implementation*" by Gerald C. Cox (paper 20.1—1987 International Test Conference), and "*Transmission Line Effects in Testing High-speed Devices with a High-performance Test System*" appearing in the Hewlett-Packard Journal, December 1989, pages 58–67. Both of these papers address problems which are encountered by high-speed automatic testers in conjunction with transmission line effects encountered during testing of CMOS integrated circuits. The Cox paper, in particular, deals with the changes to the CMOS rise/fall times, which take place as a result of transmission line effects. This paper also discusses modifications which are made to the test system to achieve matching between the generator and the constant impedance transmission line, which is mismatched at its opposite end.

It is desirable to provide an automated method of verifying the capacitive loads on all DUT signal pins on a load board, which method is easy to implement, and which does not require any external fixtures.

SUMMARY OF THE INVENTION

It is an object of this invention to provide an improved method for measuring capacitive loads on device load boards.

It is another object of this invention to provide an improved method for verifying the presence or absence of capacitors on various pins of a test circuit load board.

It is a further object of this invention to provide an automated method for verifying the presence and value of capacitors on different pins of a load board through operation of the tester without additional external fixtures.

In accordance with a preferred embodiment of this invention, an automated integrated circuit tester has its outputs connected with the different pins of an integrated circuit test load board. Each pin is supplied with a signal; and the rise time of the reflected waveforms provides an indication of the capacitance present on the pin. This information is used to compute the value of the capacitance on the load board pin to determine whether the expected capacitance is present on that pin.

DETAILED DESCRIPTION

Reference now should be made to the drawings, in which the same reference numbers are used in the different figures to designate the same components.

Figure 1:
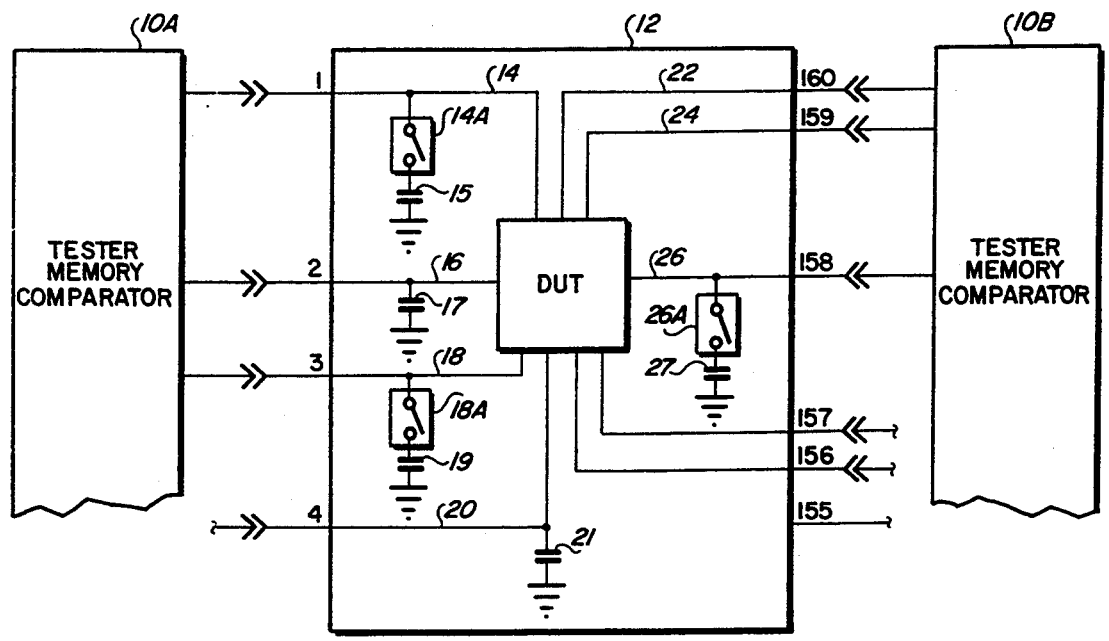
FIG. 1 is a diagrammatic representation of the circuit interconnections used in practicing a preferred embodiment of the invention.

FIG. 1 illustrates typical interconnections between a tester 10A/10B and an integrated circuit test load board 12. As illustrated in FIG. 1, a high speed automatic tester 10A/10B is shown in two parts, on opposite sides of the load board 12, for ease of illustration. The tester 10A/10B, however, in actual practice, consists of a single unit including the electronics necessary for providing the necessary input/output signals, as well as power supply and ground potentials to selected pins of an integrated circuit device undergoing test (DUT) on the load board 12. In order to provide high speed testing and still maintain good signal fidelity, current IC testers implement transmission line techniques with controlled impedance environments. One such tester is the Credence LT 1000 Series which maintains a 50 Ohm transmission line environment. This tester also has the ability to both and drive and compare the same signal for each tester pin. Other testers, utilizing similar transmission line characteristics, also have been developed.

In a high speed transmission line tester, such as the Credence LT 1000 Series tester, the transmission line environment is such that when a generator (EGEN) with a matching source impedance develops a voltage step of 0 V to 5 V into an unterminated transmission line, EGEN/2 first propagates down the line. When the signal reaches the end of the line, the signal doubles in amplitude and reflects back toward the generator.

Figure 2:
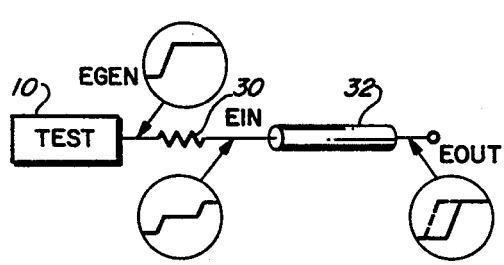
FIG. 2 is a representative circuit diagram including representative waveforms of operation of the method of a preferred embodiment of the invention.

FIG. 2 is a diagrammatic illustration of this operation. In FIG. 2, the tester 10 is shown supplying a signal EGEN through a tester impedance 30 into a matched 50 Ohm transmission line 32. The delayed signal EOUT is shown at the right-hand end of the transmission line 32; and the reflected-back signal EIN appears at the junction between the resistance 30 and the transmission line 32, as illustrated in FIG. 2. The representative waveforms of these different signals, at these different points in the circuit, are illustrated in the circles in FIG. 2, with arrows pointing to the places where these signals are measured. These signal characteristics are typical of high speed testers operating in a transmission line environment.

Figure 3:
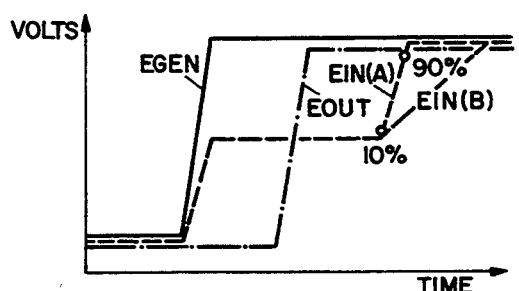
FIG. 3 is a composite waveform diagram of the representative waveforms shown in FIG. 2.

FIG. 3 is a composite waveform diagram of the three different signals EGEN, EOUT and EIN shown in FIG. 2. It should be noted that these signals appear on the tester outputs for each of the pins of the load board 12 for the device under test (DUT). Only a single transmission line environment connection has been shown in FIG. 2, since the operation is identical for all of the pins which are to undergo test.

In the operation of a high speed integrated circuit tester, such at the Credence LT 1000, the slope of the reflected waveform (EIN) is characteristic of, or varies in accordance with, the value of any capacitor on the line. When the load board 12 is designed to interface with a specific device under test (DUT), the load board is manufactured with a variety of different value chip capacitors soldered to it or connected to it through relays. In FIG. 1, typical soldered chip capacitors 17 and 21 are shown on the leads 16 and 20, used to interconnect the load board 12 with the tester portion 10A. Other capacitors are often tied to the DUT on the load board 12 through relays; and three such capacitors 15, 19 and 27, are illustrated connected to the leads 14, 18 and 26, respectively. The relay connections for these relay connected capacitors are illustrated as being effected through connector switches 14A, 18A and 26A in FIG. 1.

To determine both the presence and the value of the various capacitors 15, 17, 19, 21 and 27, the tester 10A/10B drives a signal on the corresponding line, and then measures the rise times of the reflected waveforms. The tester signal first is disconnected from the load board 12, and the rise time (TR1) of the reflected waveform EIN(a) is measured at the ten percent and ninety percent points of the reflected waveform. Next, the tester connections from the tester 10A/10B to the load board 12 are effected, and the rise time (TR2) of the reflected waveform EIN(b) is measured. The two rise time values (TR1 and TR2) then are applied to the following formula to compute the total amount of edge loading capacitance Ceff (in picofarads (pf)) that is on the specific path for that pin:

$$C_{eff} = \sqrt{\frac{tr2^2 - tr1^2}{(2.2) Z_o}}$$

Figure 4:
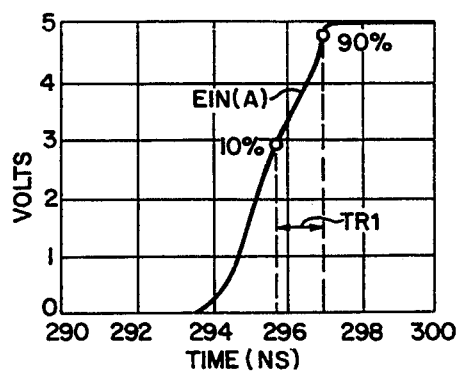
FIGS. 4 and 5 are representative waveforms used in explaining the operation of the preferred embodiment of the invention.
Figure 5:
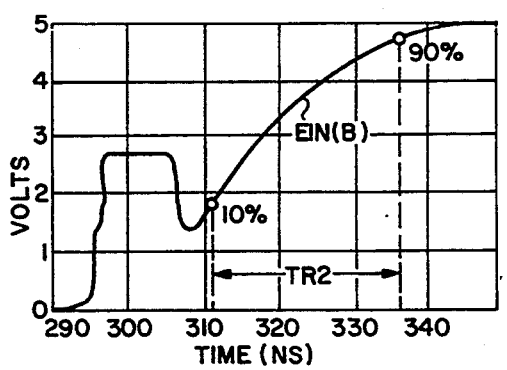

The rise time TR1 for a typical disconnected or open transmission line is illustrated in FIG. 4, and constitutes the time in nanoseconds between the ten percent and ninety percent points identified as EIN(a) in FIGS. 3 and 4. Similarly, the rise time TR2 for a load line which is connected to the load board 12, and which does have a capacitor on it, is illustrated in FIG. 5. Again, the time is shown in nanoseconds, and the rise time between the ten percent and the ninety percent points for the signal EIN(b) is illustrated in FIGS. 3 and 5. These two rise times, in nanoseconds, constitute TR1 and TR2 in the above formula. $Z_o$ is equal to the impedance of the environment, and with a Credence LT 1000 Series tester this value is 50 Ohms.

The information concerning the rise time for the open-ended or disconnected tester output derived from the reflected portion of the waveform EIN(a) shown in FIG. 4 is loaded into a memory in the tester 10A/10B for use in the computation of the above formula in the tester 10A/10B. When the tester is connected to the load board 12 and signals of the type shown in FIG. 5 are obtained, the algorithm of the above identified formula is employed to provide a direct readout of the edge loading capacitance on the line that connects to the lead of the device under test in the load board 12.

The method which is described above takes advantage of the reflection phenomenon of transmission lines by treating the reflected waveform (EIN) as a complete waveform. It is this phenomenon that allows the capacitance measurement to be made without any external fixturing for the tester 10A/10B and load board 12. The method measures only the edge loading capacitance, that is, only the capacitance which is seen by a DUT during its transition time. When this method is used, the measured value of capacitance consistently falls within 30 pf of the expected value.

The method may be applied to a variety of different LT 1000 Series load boards 12, namely dual site, single site or ping-pong load boards, using a wide variety of capacitor values. Capacitors values ranging from 30 pf to 600 pf have been verified by use of the method described above. The error factors, which contribute to a 30 pf measurement tolerance, are produced by capacitor tolerances, tester measurement inaccuracies, capacitor placement on the path, or any discontinuities on the path, such as relays or stubs. For most cases, however, verification of the presence or absence of a capacitor on a given test line is sufficiently accurate within this 30 pf tolerance range to provide the operator of the tester 10A/10B and load board 12 with sufficient information to verify that the load board capacitors are in place (or missing, therefore requiring replacement).

The operation of the test sequence which has been described above is incorporated into the load board verification portion of each test program, which is run prior to testing any product or DUT. By verifying the correct presence or absence of capacitors on the load board traces in the test environment prior to testing product, a significant improvement in the overall quality of the subsequent testing of DUT's on the load board 12 is achieved.

The following measurement results were taken on a Credence LT 1101 tester with a variety of different capacitors, using the method described above for a load board 12:

TABLE 1

| ***20pf test Bare Board *** | | |
|---|---|---|
| Pin 1 | measures | 17.14pf of load capacitance |
| Pin 2 | measures | 19.60pf of load capacitance |
| Pin 3 | measures | 15.54pf of load capacitance |
| Pin 4 | measures | 20.69pf of load capacitance |
| Pin 5 | measures | 14.07pf of load capacitance |
| *** 50pf test no relay *** | | |
| Pin 17 | measures | 45.26pf of load capacitance |
| Pin 18 | measures | 53.25pf of load capacitance |
| Pin 89 | measures | 37.45pf of load capacitance |
| Pin 90 | measures | 49.20pf of load capacitance |
| Pin 91 | measures | 30.23pf of load capacitance |
| Pin 92 | measures | 45.34pf of load capacitance |
| *** 60pf test no relay *** | | |
| Pin 85 | measures | 54.30pf of load capacitance |
| Pin 86 | measures | 58.86pf of load capacitance |
| Pin 87 | measures | 53.01pf of load capacitance |
| Pin 88 | measures | 58.97pf of load capacitance |
| *** 250pf test no relay *** | | |
| Pin 43 | measures | 243.79pf of load capacitance |
| Pin 44 | measures | 246.90pf of load capacitance |
| Pin 45 | measures | 239.01pf of load capacitance |
| Pin 46 | measures | 249.34pf of load capacitance |
| Pin 110 | measures | 252.54pf of load capacitance |
| Pin 119 | measures | 245.10pf of load capacitance |
| *** 50pf test relayed *** | | |
| Pin 113 | measures | 39.81pf of load capacitance |
| Pin 127 | measures | 69.12pf of load capacitance |
| Pin 128 | measures | 63.10pf of load capacitance |
| Pin 129 | measures | 36.85pf of load capacitance |
| Pin 130 | measures | 39.78pf of load capacitance |
| *** 120pf test relayed *** | | |
| Pin 11 | measures | 115.00pf of load capacitance |
| Pin 12 | measures | 116.46pf of load capacitance |
| *** 250pf test relayed *** | | |
| Pin 114 | measures | 247.38pf of load capacitance |
| Pin 115 | measures | 256.73pf of load capacitance |
| Pin 116 | measures | 248.96pf of load capacitance |

The computation of the capacitance values in Table 1 were made in accordance with the foregoing formula and clearly indicate the correct capacitance values within the 30 pf tolerance range described. Any computation which is out of this range indicates a need for the tester operator to manually verify that particular pin only.

The foregoing description of the preferred embodiment of the invention is to be considered as illustrative and not as limiting. Various changes and modifications will occur to those skilled in the art. For example, while the foregoing description has been made in conjunction with a specific brand of high speed automated tester, other types of integrated circuit testers employing transmission line techniques also may be used in practicing the invention. Various other changes and modifications will occur to those skilled in the art, without departing from the true scope of the invention as defined in the appended claims.

I claim:

1. A method for measuring capacitive loads on the signal pins of a load board for testing integrated circuit devices using a tester employing transmission line techniques, said method including the steps of:
   driving a voltage step of predetermined magnitude on an unconnected output of the tester;
   measuring the rise time of the reflected waveform on the unconnected output of the tester;
   connecting the output of the tester with a signal pin on a load board;
   driving a voltage step of said predetermined magnitude on the connected output of said tester;
   measuring the rise time of the reflected waveform on the connected output of said tester; and
   computing the value of the effective capacitance on said signal pin from the measured rise times of the reflected waveform on the unconnected output and the connected output of the tester.

2. The method according to claim 1 wherein said computing step comprises an analysis of the differences in the rise times of the reflected waveforms on the unconnected output of the tester and on the connected output of the tester.

3. The method according to claim 2 wherein the step of computing the effected value of capacitance is effected through the following formula:

$$C_{eff} = \sqrt{\frac{tr2^2 - tr1^2}{2.2 \times Z_o}}$$

where Ceff is the effective capacitance, tr2 is the measured rise time of the reflected waveform on the connected output of the tester, tr1 is the measured rise time of the reflected waveform on the unconnected output of the tester; and $Z_o$ is the impedance of the transmission line environment.

4. The method according to claim 3 wherein both of the steps of measuring said rise time measure the rise time of the reflected waveform between the ten percent value and the ninety percent value thereof.

5. The method according to claim 1 wherein the step of computing the effected value of capacitance is effected through the following formula:

$$C_{eff} = \sqrt{\frac{tr2^2 - tr1^2}{2.2 \times Z_o}}$$

where Ceff is the effective capacitance, tr2 is the measured rise time of the reflected waveform on the connected output of the tester, tr1 is the measured rise time of the reflected waveform on the unconnected output of the tester; and $Z_o$ is the impedance of the transmission line environment.

6. The method according to claim 1 wherein both of the steps of measuring said rise time measure the rise time of the reflected waveform between the ten percent value and the ninety percent value thereof.

* * * * *